US012155006B2

(12) United States Patent
Napierala

(10) Patent No.: US 12,155,006 B2
(45) Date of Patent: Nov. 26, 2024

(54) LIGHT-EMITTING DIODE AND MANUFACTURING METHOD

(71) Applicant: ALEDIA, Echirolles (FR)

(72) Inventor: Jérôme Napierala, Saint Egreve (FR)

(73) Assignee: ALEDIA, Echirolles (FR)

( * ) Notice: Subject to any disclaimer, the term of this patent is extended or adjusted under 35 U.S.C. 154(b) by 355 days.

(21) Appl. No.: 17/627,823

(22) PCT Filed: Jul. 16, 2020

(86) PCT No.: PCT/EP2020/070212
§ 371 (c)(1),
(2) Date: Jan. 18, 2022

(87) PCT Pub. No.: WO2021/009316
PCT Pub. Date: Jan. 21, 2021

(65) Prior Publication Data
US 2022/0262977 A1   Aug. 18, 2022

(30) Foreign Application Priority Data
Jul. 18, 2019   (FR) ...................................... 1908165

(51) Int. Cl.
*H01L 33/02*       (2010.01)
*H01L 33/12*       (2010.01)
(Continued)

(52) U.S. Cl.
CPC ............ *H01L 33/025* (2013.01); *H01L 33/12* (2013.01); *H01L 33/18* (2013.01); *H01L 33/24* (2013.01)

(58) Field of Classification Search
CPC ....... H01L 33/025; H01L 33/12; H01L 33/18; H01L 33/24; H01L 33/02
See application file for complete search history.

(56) References Cited

U.S. PATENT DOCUMENTS

| 6,133,589 A * | 10/2000 | Krames ................. H01L 33/025 |
| | | 257/E33.067 |
| 2011/0064103 A1* | 3/2011 | Ohta ................... H01L 21/0254 |
| | | 372/45.01 |

(Continued)

OTHER PUBLICATIONS

De Mierry et al, P., "Green emission from semipolar InGaN quantum wells grown on low-defect (112 2) GaN templates fabricated on patterned r-sapphire: Green emission from semipolar InGaN quantum wells," Phys. Status Solidi B, vol. 253, No. 1, Nov. 25, 2015, pp. 105-111.

(Continued)

*Primary Examiner* — Mohammad A Rahman
(74) *Attorney, Agent, or Firm* — HAUPTMAN HAM, LLP

(57) ABSTRACT

A light emitting diode (LED) having an active region and a three-dimensional (3D) structure. The 3D LED includes a first GaN-based layer having a first content of Aluminium and a first content of Indium, and a second GaN-based layer interposed between and in contact with the first layer and the active region, having a second content of Aluminium and a second content of Indium, the second content of indium being strictly higher than the first content of indium so as to promote the formation of misfit dislocations at an interface between the first and second layers. Advantageously, the active region and the first and second layers extend along semi-polar crystallographic planes. Also described is a method for manufacturing such a 3D LED.

14 Claims, 3 Drawing Sheets

(51) Int. Cl.
   *H01L 33/18* (2010.01)
   *H01L 33/24* (2010.01)

(56) References Cited

U.S. PATENT DOCUMENTS

2013/0118400 A1* 5/2013 Goh ..................... C30B 19/12
                                                 117/54
2016/0072007 A1* 3/2016 Choi .................. H01L 33/0025
                                                 315/291

OTHER PUBLICATIONS

Ko et al, Y.H., "Red Emission of InGaN/GaN Double Heterostructures on GaN Nanopyramid Structures," ACS Photonics, vol. 2, No. 4, Feb. 13, 2015, pp. 515-520.

Zhao et al, Y., "Toward ultimate efficiency: progress and prospects on planar and 3D nanostructured nonpolar and semipolar InGaN light-emitting diodes," Advances in Optics and Photonics, vol. 10, No. 1, Feb. 16, 2018, p. 246.

International Search Report issued in corresponding International Application No. PCT/EP2020/070212, mailed Sep. 29, 2020, pp. 1-3, European Patent Office, Rijswijk, Netherlands.

Written Opinion issued in corresponding International Application No. PCT/EP2020/070212, mailed Sep. 29, 2020, pp. 1-8, European Patent Office, Rijswijk, Netherlands.

* cited by examiner

LIGHT-EMITTING DIODE AND MANUFACTURING METHOD

The present application is a U.S. National Phase of International Application Number PCT/EP2020/070212, filed Jul. 16, 2020, which claims priority to French Application No. 1908165, filed Jul. 18, 2019.

TECHNICAL FIELD

The invention relates to the field of optoelectronics. It finds a particularly advantageous application in the field of gallium nitride (GaN) based light-emitting diodes having a three-dimensional structure.

STATE OF THE ART

Gallium nitride (GaN) based light-emitting diodes (LEDs) are generally manufactured using a technology called planar technology, which consists in forming on a base plane a stack of two-dimensional (2D) layers in a direction normal to the base plane.

This stack generally comprises a region called active region where radiative recombinations of electron-hole pairs occur, which allow to obtain light radiation having a main wavelength.

For display applications, LEDs can be configured to produce light radiation whose main wavelength is in the blue, or in the green, or in the red.

A structuring of this stack a posteriori, for example by lithography/etching steps, then allows to form a plurality of light-emitting diodes each having a mesa structure. The mesa structure typically has a top face and side walls. These side walls obtained by a posteriori structuring generally have defects favouring the appearance of non-radiative surface recombinations.

In the case of micro-LEDs, for a mesa size less than a few tens of microns, for example less than 10 μm, the surface area/volume ratio of the mesa increases and the influence of the side walls becomes significant. Particularly, the rate of non-radiative recombinations of such a micro-LED increases, due to the increasing share of non-radiative surface recombinations. The performance of these micro-LEDs is therefore deteriorated.

To reduce the mesa sidewall defects, directly forming a three-dimensional (3D) structure is a promising alternative to structuring a two-dimensional (2D) planar stack. Such an alternative allows in particular to significantly reduce the rate of non-radiative surface recombinations.

FIGS. 1A and 1B show such 3D structures used for manufacturing LEDs and/or micro-LEDs.

These 3D structures can be in the shape of GaN-based microwires or nanowires extending mainly in a direction normal to the basal plane.

They can be formed by epitaxial growth from a nucleation layer 12 partially covered by a masking layer 13.

In these examples, the nucleation layer 12 is two-dimensional and extends in the basal plane. The growth of the 3D structures takes place through the openings 130 of the masking layer 13.

These 3D structures can have different internal architectures.

FIG. 1A illustrates a first architecture called axial architecture. According to this axial architecture, the active region 123 extends transversely, parallel to the basal plane, within the 3D structure.

Such an axial architecture allows in particular to incorporate a high concentration of indium (In) in the active region 123 based on GaN. Such an active region 123 can emit light radiation whose wavelength is in the green or in the red.

This axial architecture can therefore be used to manufacture green or red 3D micro-LEDs.

However, such an architecture has a low radiative yield.

Moreover, the distribution of indium in the active region, for high concentrations of Indium, is generally not homogeneous in this type of axial architecture.

FIG. 1B illustrates a second architecture called radial architecture. According to this radial architecture, the active region 123 extends along the sides of the 3D structure, perpendicularly to the basal plane.

Such a radial architecture has good radiative yield for LEDs emitting in the blue.

However, this yield collapses for indium-rich radial active regions 123 emitting light radiation with a wavelength greater than 500 nm.

This radial architecture is therefore not optimal for manufacturing green or red 3D micro-LEDs.

Existing solutions of 3D-structured LED therefore do not allow to obtain a significant incorporation of indium and a high radiative yield.

The present invention aims at least at partially overcoming some of the disadvantages mentioned above.

Particularly, an object of the present invention is to provide a GaN based 3D structured-light-emitting diode (LED) allowing to incorporate a high content of indium in the active region while preserving, or even increasing, the radiative yield.

Another object of the present invention is to provide a GaN based 3D structured-light-emitting diode (LED), the distribution of indium of which is homogenised.

Another object of the present invention is to provide a method for manufacturing such a 3D GaN LED.

The other objects, features and advantages of the present invention will become apparent upon examining the following description and the appended drawings. It is understood that other advantages can be incorporated.

SUMMARY

To achieve the objectives mentioned above, the present invention provides according to a first aspect a light-emitting diode (LED) having a three-dimensional (3D) structure based on gallium nitride (GaN) and comprising an active region based on indium gallium nitride (InGaN) intended to emit light radiation. The three-dimensional (3D) structure is in the shape of a wire with a tapered top (3D structure called 3D pencil structure) or in the shape of a pyramid (3D structure called 3D pyramid structure).

This light-emitting diode further comprises:
 a first GaN-based layer having a first content of Aluminium and a first content of Indium, and
 a second GaN-based layer interposed between the first layer and the active region and in contact therewith, having a second content of Aluminium and a second content of Indium.

Advantageously, the second content of indium is strictly greater than the first content of indium so as to generate a formation of dislocations of lattice parameter mismatch at an interface between the first and second layers.

Advantageously, the active region, the first and second layers extend along semi-polar crystallographic planes.

The developments leading to the present invention have made it possible to identify that:

the incorporation of indium into the active region depends in particular on the polarity of the layers forming the active region and the management of mechanical stresses in the 3D structure, the rate of radiative recombinations and hence the radiative yield depend in part on the strength of the piezoelectric field induced in the InGaN-based active region. This piezoelectric field also depends on the polarity of the layers forming the active region.

It appeared that the existing solutions of 3D-structured LED do not allow to effectively control the incorporation of indium, the appearance of mechanical stresses and the intensity of the piezoelectric field.

In the case of an axial architecture (FIG. 1A), the active region is formed on polar planes (planes c or –c of the hexagonal crystallographic structure of the GaN-based material, illustrated in FIG. 2A) which induce a strong piezoelectric field within the active region.

This strong piezoelectric field generates a spatial separation of the charge carriers (electrons and holes). This separation of the carriers considerably reduces the rate of electron-hole recombinations. The internal Quantum Efficiency IQE and radiative yield are low.

The polar planes of the axial architecture allow a relatively large amount of indium to be incorporated into the active region.

However, by increasing the concentration of indium $[In]_a$ in the active region, for example for $[In]_a > 17\%$, the InGaN-based material of the active region is increasingly mechanically stressed. Structural defects can therefore be formed by plastic stress relaxation in the active region. This reduces the IQE efficiency and the radiative yield of the active area. The increase in mechanical stresses and/or plastic relaxation further promotes an inhomogeneous distribution of indium within the active region.

In the case of a radial architecture (FIG. 1B), the active region is formed on non-polar planes (planes a or m of the hexagonal crystallographic structure of the GaN-based material, shown in FIG. 2B).

The plastic stress relaxation in non-polar planes appears earlier than in polar planes. Such a crystallographic orientation promotes the appearance of crystal defects. These crystal defects, particularly stacking faults, form and therefore spread rapidly in the active region.

In order to minimise the intensity of the piezoelectric field while optimising the incorporation of indium into the active region, the present invention provides for forming the active region on semi-polar planes, as illustrated in the FIGS. 10, 2C. Such an architecture is called pyramid architecture in the following.

Semi-polar planes have a weak or zero piezoelectric field, unlike polar planes. According to one example, the semi-polar planes are preferably of the {10-11} type (FIG. 2C) and have a practically zero piezoelectric field.

The internal quantum efficiency IQE of the pyramid architecture is thus improved compared to that of the axial architecture.

The emission of light radiation at the main wavelength also have improved stability over a wide range of current density.

The semi-polar planes further allow a greater amount of indium to be incorporated than the non-polar planes.

This pyramid architecture also improves the incorporation of indium, relative to the radial architecture.

Moreover, to effectively release the mechanical stresses at the active region, the present invention provides for forming in the 3D structure, parallel to the semi-polar planes, first and second GaN-based layers respectively poor in indium and rich in indium. These first and second layers are also referred to, hereinafter, as "stress relaxation structure".

The difference in lattice parameter between the first and second layers allows to generate dislocations of lattice parameter mismatch, commonly called "misfit dislocations", at the interface between the first layer and the second layer.

The appearance of misfit dislocations (MD) corresponds to plastic relaxation of the first and second layers.

The stress relaxation structure thus allows to form the active region on a relaxed GaN-based material.

The content of indium incorporated in this active region can therefore be increased by minimising the concentration of structural defects in this active region.

Moreover, the uniformity of indium distribution within the at least partially relaxed active region is improved.

Preferably, the first and second layers are also respectively rich in aluminium (Ga(In)AlN) and poor in aluminium (Ga(Al)InN). The addition of aluminium allows to accentuate the difference in lattice parameters between the first and second layers. It is therefore not necessary to form a second layer very rich in indium to obtain the difference in lattice parameters required for the appearance of MDs. This allows to prevent the absorption of light radiation by a second layer too rich in indium.

Synergistically, the misfit dislocations generated by the stress relaxation structure are confined to the semi-polar planes of the pyramid architecture.

Therefore, the misfit dislocations do not propagate to the active region, unlike structural defects generated in the polar or non-polar planes.

The distance d necessary between the interface and the active region to avoid a parasitic influence of the misfit dislocations on the operation of the active region, particularly on the charge area of the space developing at the active region, can be minimised.

The confinement of the misfit dislocations at the interface therefore allows to limit the thickness of the second layer to a thickness less than 150 nm, for example comprised between 10 nm and 150 nm.

Such an integrated stress relaxation structure according to the pyramid architecture therefore allows efficient management of mechanical stresses. Other advantages related to this improved stress management will be detailed below. This improved stress management generally improves the IQE.

A LED based on this pyramid architecture with a stress relaxation structure therefore has improved radiative yield, particularly for configurations of light radiation emission in the green or in the red.

A second aspect of the present invention relates to a method for manufacturing a gallium nitride (GaN) based light-emitting diode (LED) having a three-dimensional (3D) structure, said diode comprising an InGaN-based active region intended to emit light radiation.

This method comprises the following steps:

Providing three-dimensional structures comprising at least one GaN-based surface layer on a substrate, said surface layer extending along semi-polar crystallographic planes, Forming on the surface layer a first GaN-based layer extending along said semi-polar crystallographic planes and having a first content of Aluminium and a first content of Indium, Directly forming on the first layer a second GaN-based layer extending along said semi-polar crystallographic planes and having a second content of Aluminium and a second content of Indium such that the second content of indium is strictly higher than the first content of indium, so as to generate a formation of dislocations of lattice parameter mismatch at an interface between the first and second layers, Directly forming on the second layer the InGaN-based active region extending along said semi-polar crystallographic planes.

BRIEF DESCRIPTION OF THE FIGURES

The purposes, objects, as well as the features and advantages of the invention will become more apparent from the detailed description of embodiments thereof which are illustrated by the following appended drawings wherein.

Figure 1A:
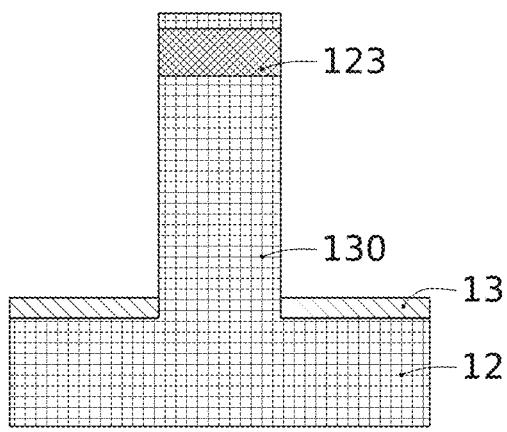
FIG. 1A illustrates 3D LED structure with an axial architecture according to the prior art.
Figure 2A:
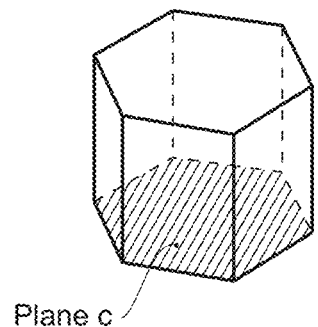
FIG. 2A illustrates a c-type polar plane with a hexagonal crystallographic structure.
Figure 1B:
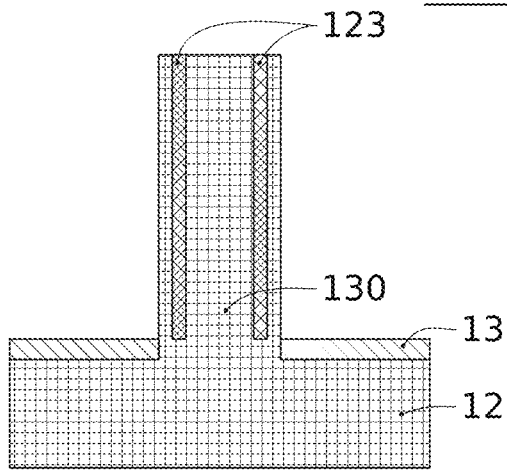
FIG. 1B illustrates 3D LED structure with a radial architecture according to the prior art.
Figure 2B:
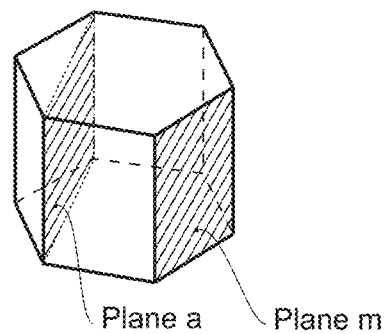
FIG. 2B illustrates non-polar a and m-type planes of a hexagonal crystallographic structure.
Figure 1C:
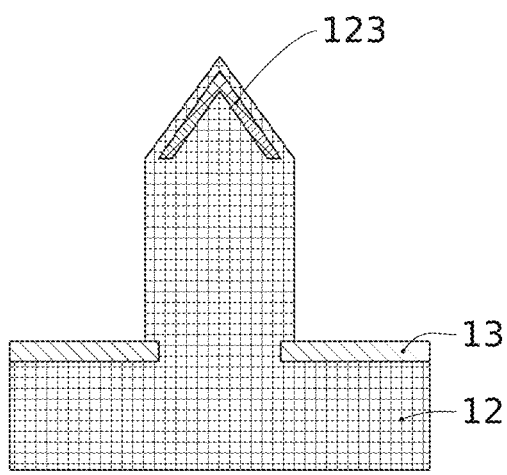
FIG. 1C illustrates a 3D LED structure with a pyramid architecture according to an embodiment of the present invention.
Figure 2C:
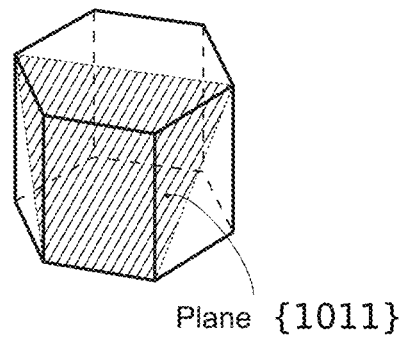
FIG. 2C illustrates a {10-11} type semi-polar plane with a hexagonal crystallographic structure.

The drawings are given by way of examples and are not limiting of the invention. They constitute principle schematic representations intended to facilitate the understanding of the invention and are not necessarily on the scale of practical applications. Particularly, the dimensions of the different layers and regions of 3D LEDs are not representative of reality.

DETAILED DESCRIPTION

Before starting a detailed review of embodiments of the invention, it is recalled that the invention according to its first aspect comprises in particular the optional features below which can be used in combination or alternatively.

According to one example, the first and/or the second content of aluminium are zero.

According to one example, the first content of indium is strictly less than the first content of aluminium.

According to one example, the first content of indium is non-zero.

According to one example, the second content of indium is strictly higher than the second content of aluminium.

According to one example, the first content of indium [In]1 is comprised between 0 and 10%.

According to one example, the second content of indium [In]2 is comprised between 3 and 25%.

According to one example, the first content of aluminium [Al]1 is comprised between 0 and 35%.

According to one example, the second content of aluminium [Al]2 is comprised between 0 and 10%.

According to one example, the interface is located at a distance d from the active region such that d>10 nm.

According to one example, the semi-polar crystallographic planes are of the {10-11} type.

According to one example, the LED is configured to emit light radiation having a wavelength comprised between 500 nm and 650 nm.

According to one example, the three-dimensional structure is called three-dimensional pencil structure and is in the shape of a wire with a tapered top.

According to one example, the three-dimensional structure is called a three-dimensional pyramid structure and is in the shape of a pyramid.

According to one example, the three-dimensional structure is formed from a planar substrate.

According to one example, the three-dimensional structure is formed from a three-dimensional substrate having a textured surface.

According to one example, the substrate is based on a material selected from silicon, GaN, sapphire.

The invention according to its second aspect comprises in particular the optional features below which can be used in combination or alternatively:

According to one example, the formation of the first and second layers and of the active region takes place by molecular beam epitaxy (MBE).

According to one example, the formation of the first and second layers and of the active region takes place on a three-dimensional substrate having a textured surface.

According to one example, the formation of the active region takes place at least in part at a temperature above 550° C.

In the present invention, the formation of a stress relaxation structure according to a pyramid architecture is particularly dedicated to the manufacture of 3D LEDs.

The invention can be implemented more widely for various optoelectronic devices with a 3D structure comprising an active region.

Active region of an optoelectronic device means the region from which the majority of the light radiation supplied by this device is emitted, or the region from which the majority of the light radiation received by this device is captured.

Therefore, the invention can also be implemented in the context of laser or photovoltaic devices.

Unless explicitly mentioned, it is specified that, in the context of the present invention, the relative disposition of a third layer interposed between a first layer and a second layer, does not necessarily mean that the layers are directly in contact with each other, but means that the third layer is either directly in contact with the first and second layers, or separated therefrom by at least one other layer or at least one other element.

The steps of forming the different layers and regions are understood in a broad sense: they can be carried out in several sub-steps which are not necessarily strictly successive.

In the present invention types of doping are indicated. These dopings are non-limiting examples. The invention covers all embodiments wherein the dopings are reversed. Thus, if an exemplary embodiment mentions for a first region a P-doping and for a second region an N-doping, the present description then describes, implicitly at least, the opposite example wherein the first region has an N-doping and the second region a P-doping.

A doping noted P encompasses all dopings by positive charge carriers regardless of the concentration of dopants.

Thus, a P-doping can be understood as a P, P+ or P++ doping. Likewise, a doping denoted N encompasses all dopings by negative charge carriers regardless of the concentration of dopants. Thus, an N-doping can be understood as an N, N+ or N++ doping.

The dopant concentration ranges associated with these different dopings are as follows:

P++ or N++ doping: greater than $1\times10^{20}$ cm$^{-3}$
P+ or N+ doping: $5\times10^{18}$ cm$^{-3}$ to $9\times10^{19}$ cm$^{-3}$
P or N doping: $1\times10^{17}$ cm$^{-3}$ to $5\times10^{18}$ cm$^{-3}$
intrinsic doping: $1\times10^{15}$ cm$^{-3}$ to $1\times10^{17}$ cm$^{-3}$ In the following, the following abbreviations relating to a material M are optionally used:

M–i refers to the intrinsic or unintentionally doped material M, according to the terminology usually used in the field of microelectronics for the suffix –i.

M–n refers to the material M doped with N, N+ or N++, according to the terminology usually used in the field of microelectronics for the suffix –n.

M–p refers to the material M doped with P, P+ or P++, according to the terminology usually used in the field of microelectronics for the suffix –p.

In the present patent application, the terms "concentration", and "content" are synonymous.

More particularly, a concentration can be expressed in relative unit such as molar or atomic fractions, or in absolute unit such as the number of atoms per cubic centimetre (at·cm$^{-3}$).

In the following, the concentrations are atomic fractions expressed in at %, unless otherwise indicated.

In the present patent application, the terms "light-emitting diode", "LED" or simply "diode" are used synonymously. A "LED" can also be understood as a "micro-LED".

A substrate, a layer, a device, "based" on a material M, means a substrate, a layer, a device comprising only this material M or this material M and optionally other materials, for example alloy elements, impurities or doping elements. Thus, a gallium nitride (GaN) based LED can for example comprise gallium nitride (GaN or GaN-i) or doped gallium nitride (GaN-p, GaN-n) or else gallium-indium nitride (InGaN), gallium-aluminium nitride (AlGaN) or gallium nitride with different contents of aluminium and indium (GaInAlN). In the context of the present invention, the material M is generally crystalline.

In the present patent application, preferentially a thickness for a layer and height for a device will be considered. The thickness is taken in a direction normal to the main extension plane of the layer, and the height is taken perpendicular to the basal plane of the substrate.

The terms "substantially", "approximately", "of the order of" mean, when they relate to a value, "within 10%" of this value or, when they relate to an angular orientation, "within 10°" of this orientation. Thus, a direction substantially normal to a plane means a direction having an angle of 90±10° with respect to the plane.

To determine the geometry of the LED, the crystallographic orientations and the compositions of the different layers, it is possible to carry out Scanning Electron Microscopy (SEM) or Transmission Electron Microscopy (TEM) or else Scanning Transmission Electron Microscopy STEM.

Micro-diffraction within a TEM allows to determine the crystallographic orientations of the different layers and regions.

TEM or STEM are also well suited to the observation and identification of structural defects, and in particular misfit dislocations. Different techniques listed below in a non-exhaustive manner can be implemented: imaging in dark field and bright field, in weak beam, in diffraction at high angles HAADF (acronym for "High Angle Annular Dark Field").

The chemical compositions of the different layers or regions can be determined using the well-known EDX or X-EDS method, acronym for "energy dispersive x-ray spectroscopy" which stands for "energy dispersive analysis of X photons".

This method is well adapted for analysing the composition of small devices such as 3D LEDs. It can be implemented on metallurgical sections in a Scanning Electron Microscope (SEM) or on thin sheets in a Transmission Electron Microscope (TEM).

All these techniques allow in particular to determine whether the optoelectronic device with a 3D structure comprises a stress relaxation structure according to semi-polar planes, as described in the present invention.

A first embodiment of a LED according to the invention will now be described with reference to FIGS. 3A to 3D.

For the sake of clarity, the following description is based on a single elementary 3D structure constituting the 3D LED. It is understood that a 3D LED can comprise a plurality of adjacent elementary 3D structures distributed on the same substrate. The other elementary 3D structures of this plurality are deemed to be substantially identical to the elementary 3D structure described below.

The elementary 3D structure obtained according to this first embodiment is a GaN-based pyramid.

Figure 3A:
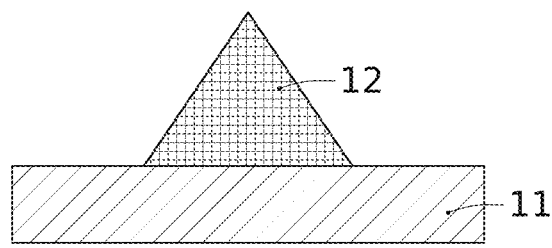
FIGS. 3A to 3D illustrate steps of manufacturing a pyramid architecture 3D LED according to one embodiment of the present invention.

A pyramid-shaped supporting structure 12 is formed in a first step (FIG. 3A).

The sides of the pyramid-shaped supporting structure 12 are oriented in semi-polar planes of a hexagonal crystallographic structure whose c axis is perpendicular to the basal plane.

According to one example, they may have an angle of approximately 80° with respect to the basal plane, so as to correspond approximately to a semi-polar plane of the {20-21} type.

According to another example, they may have an angle of about 60° with respect to the basal plane, so as to correspond approximately to a semi-polar plane of the {10-11} type.

This supporting structure 12 can be made of a GaN-based material.

Such a structure can be obtained from a flat substrate 11, for example made of silicon or sapphire, optionally surmounted by a GaN-based nucleation layer (not shown).

A masking layer, for example made of silicon nitride Si$_3$N$_4$, comprising openings can allow localised growth of the GaN-based material. These openings typically have a dimension, for example a diameter or an average diameter, comprised between 50 nm and 30 μm. The distance separating two openings can be comprised between 100 nm and 10 μm. These openings can be made by UV or DUV lithography (acronym for Deep UV) or by electron beam lithography.

According to one possibility, the supporting structure 12 grows through an opening in the masking layer. The diameter at the base of the supporting structure 12 is therefore substantially equal to that of the corresponding opening.

The growth of the GaN-based material can be done by Molecular Beam Epitaxy MBE, by vapour phase epitaxy with chlorinated gas precursors HVPE (acronym for "Hydride Vapour Phase Epitaxy"), by Chemical Vapour Deposition CVD and MOCVD (acronym for "MetalOrganic Chemical Vapour Deposition"), by vapour phase epitaxy with organometallic precursors MOVPE (acronym for "MetalOrganic Vapour Phase Epitaxy"). Optionally, conventional surface preparation steps (chemical cleaning, heat treatment) can be carried out prior to growth.

Germination islands can thus appear at the start of growth at the openings of the masking layer and, depending on the growth conditions, develop in the shape of pyramids during growth. Particularly, growth conditions for which the ratio of V/III elements, typically the Ga/N ratio, is greater than or equal to 100 promote the growth of these islands in the shape of pyramids.

A supporting structure 12 in the shape of a GaN-based pyramid is thus obtained (FIG. 3A).

According to one example, the GaN-based material of this supporting structure 12 can be an InGaN alloy which is conventionally used for the manufacture of green or red LEDs.

Such a massive InGaN supporting structure 12, however, has a significant absorption at the emission wavelength of the green or red light radiation.

The present invention provides a stress relaxation structure which allows to overcome the use of a massive InGaN supporting structure, generally necessary for the subsequent formation of an InGaN based active region.

Consequently and preferably, the GaN-based material of the supporting structure 12 can be made of massive GaN. The absorption by the supporting structure 12 of the light radiation emitted by the LED is thus greatly reduced. The yield of the LED can be improved.

According to another example, the GaN-based material of this supporting structure 12 may be an AlGa(In)N alloy, the aluminium content of which is greater than the indium content.

Alternatively, the substrate 11 in turn can be textured so as to have pyramid islands on the surface.

A thin layer of GaN or InGaN can in this case be deposited on these pyramid islands so as to form the supporting structure(s) 12.

In this case, the supporting structure 12 may consist mainly of the material of the substrate, for example silicon, and of the thin GaN-based layer surmounting this material.

The supporting structure 12 can comprise an N-doped GaN based region. In a known manner, this N-doped region can result from a growth, implantation and/or activation annealing. The N-doping can in particular be obtained directly during growth, from a source of silicon or germanium, for example by adding silane or disilane or germane vapour.

Figure 3B:
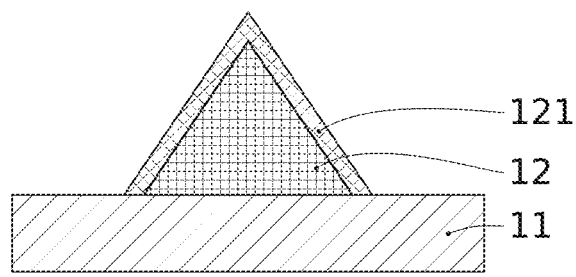

The first layer 121 of the stress relaxation structure can then be formed, in a second step (FIG. 3B).

It is based on GaAl(In)N, and preferably based on GaAlN.

The concentration of indium $[Al]_1$ of this first layer 121 can be comprised between 0 and 10%.

The concentration of aluminium $[Al]_1$ of this first layer 121 can be comprised between 0 and 35%.

The first layer 121 has a thickness preferably comprised between 10 nm and 150 nm.

Figure 3C:
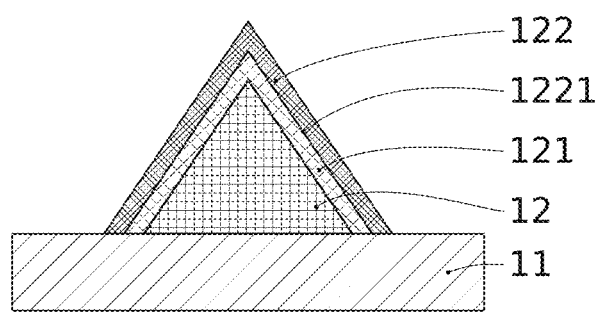

The second layer 122 of the stress relaxation structure is then formed directly in contact with the first layer 121, in a third step (FIG. 3C).

It is based on GaIn(Al)N, and preferably based on GaInN.

The concentration of indium $[In]_2$ of this second layer 122 can be comprised between 3 and 25%.

The concentration of aluminium $[Al]_2$ of this second layer 122 can be comprised between 0 and 10%.

The second layer 122 preferably has a thickness comprised between 10 nm and 150 nm.

The respective concentrations $[In]_1$, $[In]_2$, $[Al]_1$, $[Al]_2$ are selected so as to generate misfit dislocations at the interface 1221 between the first and second layers 121, 122, while minimising absorption of the light radiation emitted by the LED by said first and second layers 121, 122.

According to one example, the concentrations of aluminium $[Al]_1$ and $[Al]_2$ are zero, and the concentrations of indium $[In]_1$ and $[In]_2$ are such that $[In]_2 > [In]_1$, and preferably $[In]_2 - [In]_1 > 10\%$.

According to another example, the aluminium concentrations $[Al]_1$ and $[Al]_2$ are non-zero and verify $[Al]_1/([In]_1 + [Al]_1) \leq 0.8$ and $[In]_2/([In]_2 + [Al]_2) \leq 0.2$.

For given concentrations of indium $[In]_1$ and $[In]_2$, a non-zero aluminium $[Al]_1$, concentration allows to accentuate the difference in lattice parameter between the first and second layers 121, 122. Consequently, this allows to lower the concentration of indium $[In]_2$ while preserving the formation of misfit dislocations at the interface 1221 between the first and second layers 121, 122.

This relative decrease in the concentration of indium $[In]_2$ allows to limit the absorption of the second layer 122.

The first and second layers 121, 122 can be formed by Molecular Beam Epitaxy MBE, by vapour phase epitaxy with chlorinated gas precursors HVPE (acronym for "Hydride Vapour Phase Epitaxy"), by chemical vapour deposition CVD and MOCVD (acronym for "MetalOrganic Chemical Vapour Deposition"), by vapour phase epitaxy with organometallic precursors MOVPE (acronym for "MetalOrganic Vapour Phase Epitaxy").

The stress relaxation structure allows for a better distribution of the stress budget in the different layers and regions of the 3D structure of the LED. It is therefore particularly advantageous in the context of good engineering of the stresses during the design of the LED or of the optoelectronic device.

The stress relaxation structure allows, for example, to uniformly distribute the stress distribution in the 3D structure of the LED. The uniformity of indium distribution in different layers and regions of the 3D structure can thus be improved.

This structure also has the purpose of forming a second InGaN-based layer 122 having a low or zero residual stress content, at least in an upper part of this layer 122.

The particular orientation of this structure according to semi-polar planes allows in particular to confine the misfit dislocations at the interface 1221. The upper part of the layer 122 is preserved. It has few or no structural defects.

Figure 3D:
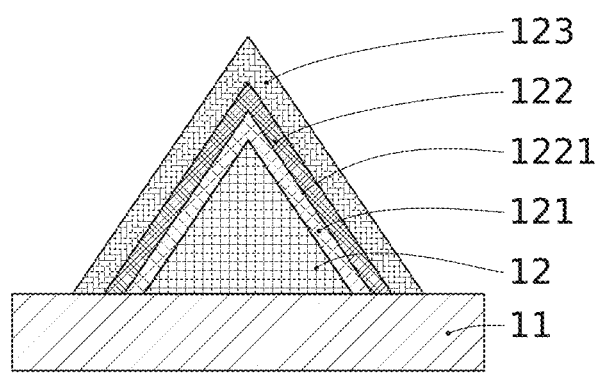

The next step aims at forming an InGaN-based active region 123 on this upper part of the layer 122 (FIG. 3D).

This active region 123 can be formed by the same epitaxy or deposition techniques implemented to form the first and second layers 121, 122. They can in particular be formed in the same growth frame.

The active region 123 can comprise, in a known manner, an alternation of InGaN quantum wells and GaN or AlGaN barriers.

The growth by epitaxy of this active region 123 takes place on a partially or totally relaxed layer 122.

The crystal quality of region 123 is therefore improved.

The distribution of indium within the quantum wells of this active region 123 also has better uniformity.

It is thus possible to increase the indium content of the quantum wells of the active region 123 while maintaining good crystalline quality and good uniformity of indium distribution.

The growth temperature of high indium content quantum wells can thus be increased. Particularly, a growth temperature of the order of or above 550° C. can be used. This also promotes obtaining InGaN-based quantum wells with good crystal quality.

The thickness of InGaN quantum wells can also be increased without exceeding the total allowable stress budget. This allows to limit the phenomenon of Auger losses in the active region 123.

The radiative yield is therefore improved.

A layer forming a P-doped GaN-based region can then be deposited on the active region 123, in order to complete the structure of 3D LEDs. In a known manner, this P-doped region can result from a growth, implantation and/or activation annealing.

A second embodiment of a LED according to the invention is illustrated in FIGS. 4A to 4D.

Only the distinctive features of this second embodiment with respect to the first embodiment are described below, the other features being deemed to be identical to those of the first embodiment.

The elementary 3D GaN-based structure obtained according to this second embodiment is a pencil structure and is in the shape of a wire with a tapered top.

Only the morphology of this 3D structure according to this second embodiment differs from the 3D structure according to the first embodiment.

The pencil-shaped supporting structure 12 formed in a first step (FIG. 4A) comprises a base 12a and a top 12b.

The sides of the base 12a are oriented substantially along the c axis of a hexagonal crystallographic structure, perpendicularly to the basal plane.

The sides of the top 12b are oriented along semi-polar planes of the hexagonal crystallographic structure.

Figure 4A:
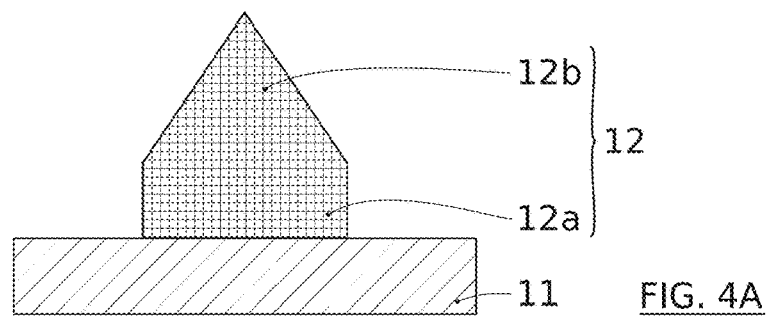
FIGS. 4A to 4D illustrate steps of manufacturing a pyramid architecture 3D LED according to another embodiment of the present invention.
Figure 4B:
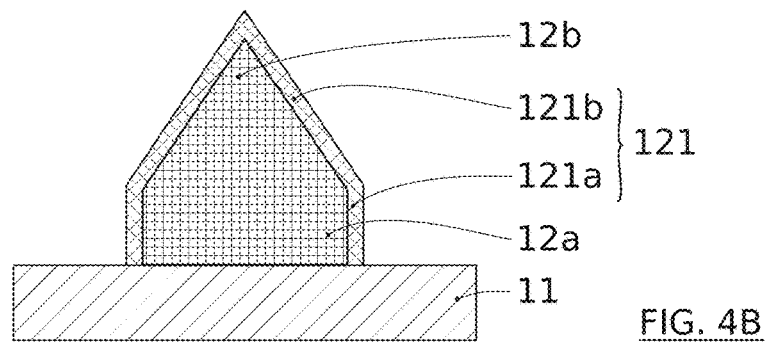
Figure 4C:
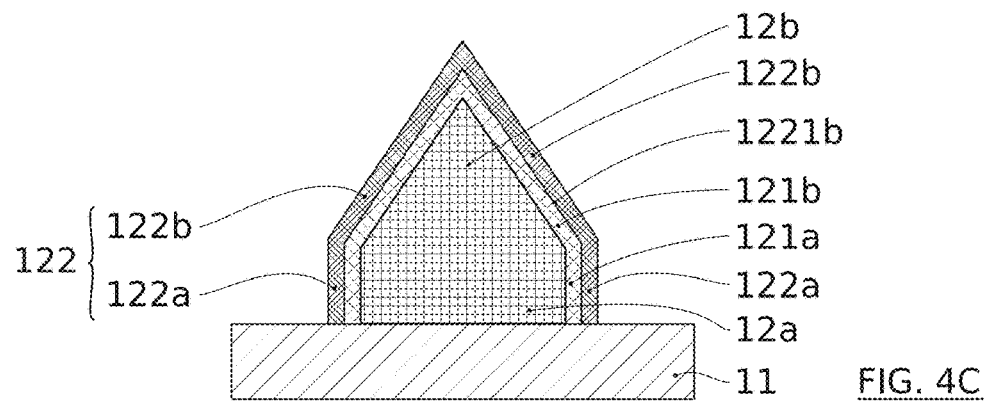
Figure 4D:
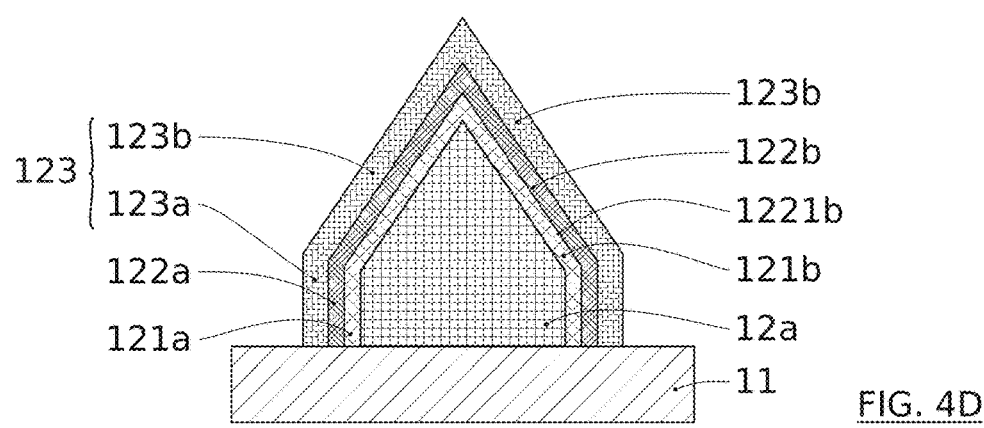

The first and second layers 121, 122, and the active region 123 are then formed on the sides of the base 12a and on the sides of the top 12b (FIGS. 4B-4D).

The steps of forming the different layers 121, 122 and regions 123 of the first embodiment can be adapted mutatis mutandis to this second embodiment.

The formation of the first layer 121 comprises in particular the formation of a portion 121a on the sides of the base 12a and the formation of a portion 121b on the sides of the top 12b. The portions 121a and 121b of the first layer 121 are continuous (FIG. 4B).

The formation of the second layer 122 comprises in particular the formation of a portion 122a on the portion 121a and the formation of a portion 122b on the portion 121b. The portions 122a and 122b of the second layer 122 are continuous (FIG. 4C). The portions 121b, 122b form a stress relaxation structure equivalent to that of the first embodiment. The interface 1221b between the portions 121b, 122b is equivalent to the interface 1221 described and illustrated for the first embodiment. It allows in particular to confine the misfit dislocations generated by the stress relaxation structure comprising the portions 121b, 122b.

The formation of the active region 123 comprises in particular the formation of a portion 123a on the portion 122a and the formation of a portion 123b on the portion 122b. The portions 123a and 123b of the active region 123 are continuous (FIG. 4D).

Due to the respective orientations of the portions 121a, 122a, 123a on the one hand, and of the portions 121b, 122b, 123b on the other hand, the compositions of the first and second layers 121, 122 and of the active region 123 may vary depending on said portions.

Particularly the indium concentrations of the portions 121a, 122a, 123a are respectively lower than the indium concentrations of the portions 121b, 122b, 123b. In contrast, the aluminium concentrations of the portions 121a, 122a, 123a are, where appropriate, substantially equal to those of the portions 121b, 122b, 123b. Therefore, the electrical injection of the charge carriers is preferably done at the portions 121b, 122b, 123b. The operation of an optoelectronic device based on a pencil-shaped supporting structure 12 as described in this second embodiment is therefore similar to the operation of an optoelectronic device based on a pyramid-shaped supporting structure 12 as described in the first embodiment. The advantages mentioned for the first embodiment are also valid for this second embodiment.

The present invention also relates to a method for manufacturing a 3D LED as described through the preceding exemplary embodiments.

The invention is not limited to the embodiments described previously and extends to all embodiments covered by the claims.

The invention claimed is:

1. A gallium nitride (GaN) based light-emitting diode (LED) having a three-dimensional (3D) structure and comprising an InGaN based active region intended to emit light radiation, said three-dimensional structure (3D) being in the shape of a wire with a tapered top or in the shape of a pyramid, said LED further comprises:
   a first GaN-based layer having a first content of aluminum and a first content of indium, and
   a second GaN-based layer interposed between the first layer and the active region and in contact therewith, said second layer having a second content of aluminum and a second content of indium, the second content of indium being strictly greater than the first content of indium so as to generate a formation of dislocations of lattice parameter mismatch at an interface between said first and second layers,
   and in that the active region and said first and second layers extend along semi-polar crystallographic planes,
   wherein the first content of aluminum and the second content of aluminum are non-zero and verify (the first content of aluminum/(the first content of indium+the first content of aluminum)) ≥0.8 and (the second content of indium/(the second content of indium+the second content of aluminum)) ≥0.2.

2. The LED according to claim 1 wherein the first content of indium is strictly less than the first content of aluminum and the second content of indium is strictly higher than the second content of aluminum.

3. The LED according to claim 1, wherein the first content of indium is comprised between 0 and 10%.

4. The LED according to claim 1, wherein the second content of indium is comprised between 3 and 25%.

5. The LED according to claim 1, wherein the first content of aluminum is from greater than 0% to 35%.

6. The LED according to claim 1, wherein the second content of aluminum is from greater than 0% to 10%.

7. The LED according to claim 1 wherein a concentration of the first content of indium and a concentration of the second content of indium are such that the concentration of the second content of indium> the concentration of the first content of indium.

8. The LED according to claim 1 wherein the interface is located at a distance d from the active region such that d>10 nm.

9. The LED according to claim 1, wherein the semi-polar crystallographic planes are of the {10-11} type.

10. The LED according to claim 1 configured to emit light radiation having a wavelength comprised between 500 nm and 650 nm.

11. The LED according to claim 1 wherein the three-dimensional structure is formed from a three-dimensional substrate having a textured surface.

12. The LED according to claim 11 wherein the substrate is based on a material selected from silicon, GaN, sapphire.

13. A method for manufacturing a gallium nitride (GaN) based light-emitting diode (LED) having a three-dimensional (3D) structure, said LED comprising an InGaN-based active region intended to emit light radiation, said method comprising the following steps:
   providing a three-dimensional structure comprising at least one GaN-based surface layer on a substrate, said surface layer extending along semi-polar crystallographic planes,
   forming on the surface layer a first GaN-based layer extending along said semi-polar crystallographic planes and having a first content of aluminum and a first content of indium,
   directly forming on the first layer a second GaN-based layer extending along said semi-polar crystallographic planes and having a second content of aluminum and a second content of indium such that the second content of indium is strictly higher than the first content of indium so as to generate a formation of dislocations of lattice parameter mismatch at an interface between said first and second layers, and
   directly forming on the second layer the InGaN-based active region extending along said semi-polar crystallographic planes,
   wherein the first content of aluminum and the second content of aluminum are non-zero and verify (the first content of aluminum/(the first content of indium+the first content of aluminum)) ≥0.8 and (the second content of indium/(the second content of indium+the second content of aluminum)) ≥0.2.

14. The method according to claim 13, wherein the formation of the first and second layers of the active region takes place on a three-dimensional substrate having a textured surface.

\* \* \* \* \*